United States Patent
Sun et al.

(10) Patent No.: US 11,789,506 B2
(45) Date of Patent: *Oct. 17, 2023

(54) AUTOMATIC VENT FOR SSD COOLING ENHANCEMENT

(71) Applicant: SK hynix NAND Product Solutions Corp., San Jose, CA (US)

(72) Inventors: Yanbing Sun, Shanghai (CN); Xiaoguo Liang, Shanghai (CN); Haifeng Gong, Shanghai (CN); Ming Zhang, Shanghai (CN)

(73) Assignee: SK hynix NAND Product Solutions Corp., Rancho Cordova, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/543,398

(22) Filed: Dec. 6, 2021

(65) Prior Publication Data

US 2022/0091645 A1    Mar. 24, 2022

Related U.S. Application Data

(63) Continuation of application No. 16/642,161, filed as application No. PCT/CN2017/104620 on Sep. 29, 2017, now Pat. No. 11,194,372.

(51) Int. Cl.
  *G06F 1/00* (2006.01)
  *G06F 1/20* (2006.01)
  (Continued)

(52) U.S. Cl.
  CPC ............ *G06F 1/206* (2013.01); *G06F 3/0604* (2013.01); *G11C 7/04* (2013.01)

(58) Field of Classification Search
  CPC .. G11C 7/04; G11C 5/04; G06F 1/206; G06F 1/20; G06F 1/163; G06F 1/185;
  (Continued)

(56) References Cited

U.S. PATENT DOCUMENTS 7,517,231 B2    4/2009  Hiew et al.
10,146,279 B2*  12/2018  Vyshetsky .............. G05B 15/02
(Continued)

FOREIGN PATENT DOCUMENTS

CN    101799707 A    8/2010
CN    102548260 A    7/2012
(Continued)

OTHER PUBLICATIONS

International Search Report and Written Opinion for International Application No. PCT/CN2017/104620, dated Jul. 6, 2018, 10 pages.
(Continued)

*Primary Examiner* — Thong Q Le (74) *Attorney, Agent, or Firm* — Byrne Poh LLP (57) ABSTRACT

Provided are devices and methods relating to temperature control in a solid state drive (SSD). One embodiment include a SSD including a housing including a plurality of sides surrounding an interior region. The SSD includes at least one vent on the housing, the at least one vent configured to be opened and closed in response to a signal. The SSD also includes a temperature sensor and a controller, the controller configured to send a signal to open the at least one vent when a temperature sensed inside the interior region reaches a first temperature, and the controller configured to close the at least one vent when a temperature sensed inside the interior region reaches a second temperature, wherein the first temperature is greater than the second temperature. Other embodiments are described and claimed.

18 Claims, 5 Drawing Sheets

(51) Int. Cl.
*G06F 3/06* (2006.01)
*G11C 7/04* (2006.01)

(58) Field of Classification Search
CPC .. G06F 13/42; G06F 2200/201; G06F 1/3275; G06F 1/186; G06F 12/0246; G06F 12/16; G06F 3/0616; G06F 3/0625; G06F 3/0629; G06F 3/0679; G06F 1/184; G06F 1/32; G06F 1/3203; G06F 1/3206; G06F 1/3225; G06F 11/3058; G06F 3/06
See application file for complete search history.

(56) References Cited

U.S. PATENT DOCUMENTS

| | | | |
|---|---|---|---|
| 11,194,372 B2 * | 12/2021 | Sun | ........... H05K 7/20181 |
| 2006/0094347 A1 | 5/2006 | Tracy et al. | |
| 2010/0182748 A1 | 7/2010 | Huang | |
| 2014/0036435 A1 | 2/2014 | Kim | |
| 2015/0003008 A1 | 1/2015 | Larsen et al. | |
| 2015/0264834 A1 | 9/2015 | Ellis et al. | |
| 2016/0093550 A1 | 3/2016 | Kumagai et al. | |
| 2016/0270205 A1 | 9/2016 | Kamimura | |
| 2017/0046088 A1 | 2/2017 | Jayaraman et al. | |
| 2017/0160775 A1 | 6/2017 | Sun et al. | |
| 2017/0205858 A1 | 7/2017 | Wong et al. | |

FOREIGN PATENT DOCUMENTS

| | | |
|---|---|---|
| CN | 102982836 A | 3/2013 |
| CN | 103176571 A | 6/2013 |
| CN | 106227309 A | 12/2016 |

OTHER PUBLICATIONS

International Preliminary Report on Patentability for International Application No. PCT/CN2017/104620, dated Apr. 9, 2020, 6 pages.
Extended European Search Report for Patent Application No. 17927208.3, dated Apr. 14, 2021, 9 pages.
Non-Final Office Action for U.S. Appl. No. 16/642,161, dated Apr. 9, 2021, 8 pages.
Notice of Allowance for U.S. Appl. No. 16/642,161, dated Aug. 3, 2021, 10 pages.

* cited by examiner

FIG. 17

AUTOMATIC VENT FOR SSD COOLING ENHANCEMENT

TECHNICAL FIELD

Embodiments relate generally to cooling enhancement for solid state drive (SSD) structures.

BACKGROUND

In certain computing systems a magnetic hard disk drive (HDD) is used to store data. The HDDs are contained in a form factor that is sized to fit into a standard sized compartment in the computing system. There are a variety of industry standard form factors for disk drives, including, but not limited to, 2.5 inch and 3.5 inch. As a user's needs change or the technology improves, a user may upgrade their disk drive by swapping out the old HDD with a new drive having the same form factor.

A solid state drive (SSD) is a data storage device that uses integrated circuit assemblies as memory to store data persistently. SSDs have no moving mechanical memory components and this distinguishes SSDs from traditional electromechanical magnetic drives, such as HDDs, which contain spinning disks and movable read/write heads. Compared to HDDs, SSDs are typically more resistant to physical shock, run silently, have lower access time, and less latency. Many types of SSDs use NAND-based flash memory which comprises an electronic (solid-state) non-volatile computer storage medium that can be electrically erased and reprogrammed. SSDs may include an enclosure surrounding a printed circuit board (PCB) with a controller chip and a plurality of memory chips positioned on opposite sides thereof, with the enclosure having an industry standard form factor, including, but not limited to, 2.5 inch and 3.5 inch form factors.

SSDs are commonly housed in an enclosure such as a die casting box having a plurality of fins positioned on a surface thereof to provide for heat dissipation during operation. As SSDs become more powerful, undesirable heat may be generated within the SSD enclosure. While the fins on the housing provide a level of heat dissipation, other heat dissipation strategies may also be employed. For example, certain SSDs utilize a housing structure including an open top and bottom frame design, thus permitting substantial air flow therein. Other SSDs include a plurality of holes on an enclosure first surface and second surface opposite the first surface, to permit airflow through the enclosure to cool the SSD.

BRIEF DESCRIPTION OF THE DRAWINGS

Embodiments are described by way of example, with reference to the accompanying drawings, in which like reference numerals may refer to similar elements.

DESCRIPTION OF EMBODIMENTS

References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to disk drives including solid state drives (SSDs) including vents for temperature control that can be opened and closed automatically.

Figure 1:
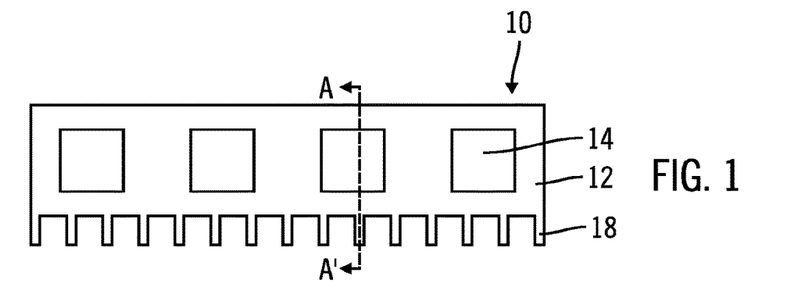
FIG. 1 illustrates a side view of a SSD in accordance with certain embodiments.
Figure 2:
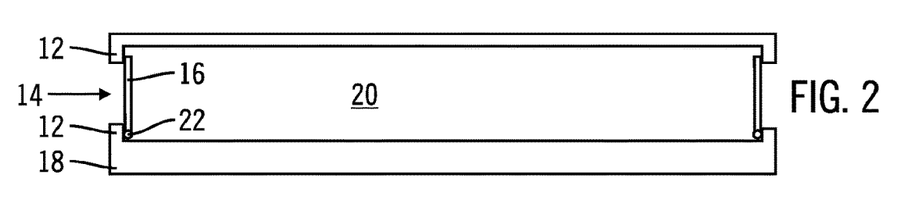
FIG. 2 illustrates a cross-sectional view of the SSD of FIG. 1, along line A-A', showing certain features in accordance with certain embodiments.

FIGS. 1-2 illustrate a SSD 10 including a housing 12 and a plurality of vents 14 through which heat from an interior of the SSD 10 can be vented out from the SSD 10. In the illustrated embodiment, a vent 14 may comprise an opening defined in the housing 12, and a structure including, but not limited to, a door (or window) 16 that can be opened and closed as desired. The housing 12 may also include a plurality of fins 18 on one or more surfaces for transmitting heat away from the SSD 10 during operation. The housing 12 may in certain embodiments be formed from a plurality of components that are coupled together. For example, in certain embodiments the housing 12 may include an upper portion and a lower portion that are coupled together. In certain embodiments, the housing 12 may comprise a suitable die casting box formed from, for example, a metal such as aluminum.

FIG. 2 illustrates a cross-sectional view of the SSD 10 of FIG. 1 along dashed line A-A', with vent 14 in the closed position. As illustrated in the embodiment illustrated in FIG. 2, the vent 14 includes the door 16 positioned to block the flow of air (or other substance) into (and out of) the interior region 20. Any suitable actuation mechanism 22 such as, for example, a roller mechanism, may be positioned in the interior region 20 and act to open and close the doors 16.

Figure 3:
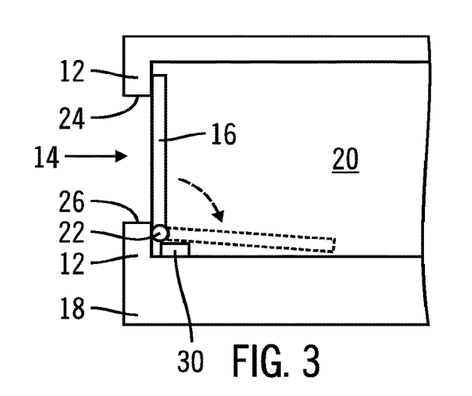
FIG. 3 illustrates a view of a portion of the SSD of FIG. 2, showing a vent in a closed position, in accordance with certain embodiments.
Figure 4:
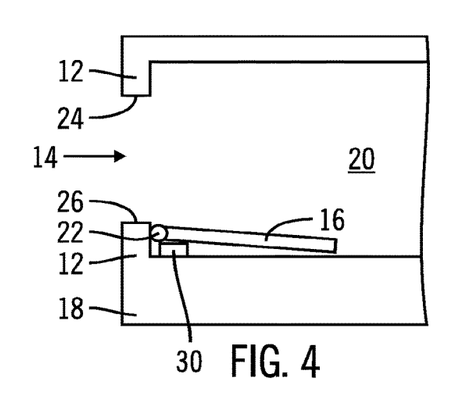
FIG. 4 illustrates a view of a portion of the SSD of FIG. 2, showing a vent in an open position, in accordance with certain embodiments.

FIGS. 3 and 4 illustrate portions of the SSD 10 in accordance with certain embodiments, with FIG. 3 showing the vent 14 in a closed position, and FIG. 4 showing the vent 14 in an opened position. In FIG. 3, the opening between surface 24 and surface 26 of the housing 12 is blocked from the interior region 20 by the door 16, thus blocking the flow of air (or other substance) to the interior region 20 of the SSD 10. FIG. 3 includes dotted lines that show the position of the door 16 in an open position and a dotted line arrow that shows the direction that the door travels when opened. The actuation mechanism 22 may be controlled in certain embodiments by any suitable switch 30 and controller device that sends a signal to the switch 30. In certain embodiments, the switch 30 may be an electromagnetic switch and the controller device may be integrated into the SSD 10.

FIG. 4 illustrates the vent 14 in an opened position, with the door 16 pivoted to extend in a direction that may in certain embodiments be substantially perpendicular to the closed position. When opened, heat can be quickly removed from the SSD 10 enclosure, for example, by flowing a gas through the vents 14 on one side of the SSD, through the interior region 20, and out through vents 14 on an opposite side of the SSD 10 enclosure.

Figure 5:
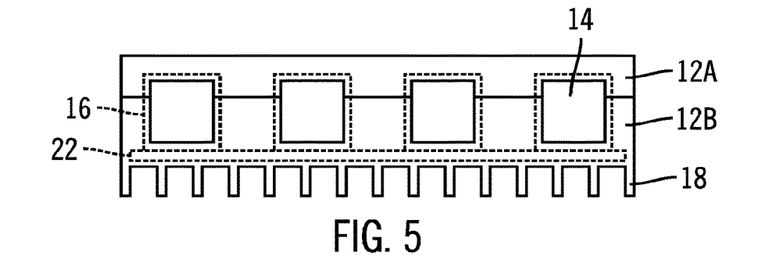
FIG. 5 illustrates a side view of a SSD, in accordance with certain embodiments.

FIG. 5 illustrates a view similar to that illustrated in FIG. 1, further including dotted lines outlining the position of the doors 16 of the vents 14 and the actuation mechanism 22, which, as seen in FIGS. 2-4, are positioned in an interior region of the SSD enclosure 10. FIG. 5 also illustrates that the housing of the SSD enclosure may in certain embodiments comprise an upper portion 12A and a lower portion 12B that are coupled together using any suitable connection mechanism, including, but not limited to, a screw mechanism.

A SSD in accordance with certain embodiments may include an enclosure and one or more sensors for SSD temperature data collection and reporting. In certain embodiments, two threshold temperatures, including $T_{OPEN}$ and $T_{CLOSE}$, may be set to control the vent open/close status. $T_{OPEN}$ may be set at or near a drive temperature specification, and $T_{CLOSE}$ may be set to a temperature that is an amount below $T_{OPEN}$, for example, approximately 3 degrees Celsius (° C.) lower than $T_{OPEN}$. The 3° C. difference may be used in certain embodiments to avoid the open/close status changing too frequently. For example, one embodiment may include a drive specification of 70° C., a $T_{OPEN}$ of 69° C., and a $T_{CLOSE}$ of 66° C. This means that the vents will be opened when the temperature reaches 69° C., and closed when the temperature reaches 66° C. A reason for keeping the vents closed is that foreign matter, including, for example, dust, may accumulate within the SSD and may lead to reliability problems. By opening the vents for a relatively short time, the amount of any foreign matter that is collected in the SSD is minimized. Other $T_{OPEN}$ and $T_{CLOSE}$ values and the difference between the $T_{OPEN}$ and $T_{CLOSE}$ values may be used. For example, in certain embodiments the temperature difference between $T_{OPEN}$ and $T_{CLOSE}$ is approximately 1° C. In other embodiments, the difference is in the range of 1° C. to 5° C. In still other embodiments, the difference is in the range of 2° C. to 4° C. If the temperature difference is too great, then the vents may be open for a substantial amount of time that allows a significant amount of foreign matter to enter the interior region of the SSD. If the temperature difference is too small, then the vents may open and close too frequently and problems such as, for example, mechanical reliability problems with the vent actuation mechanism may occur.

Figure 6:
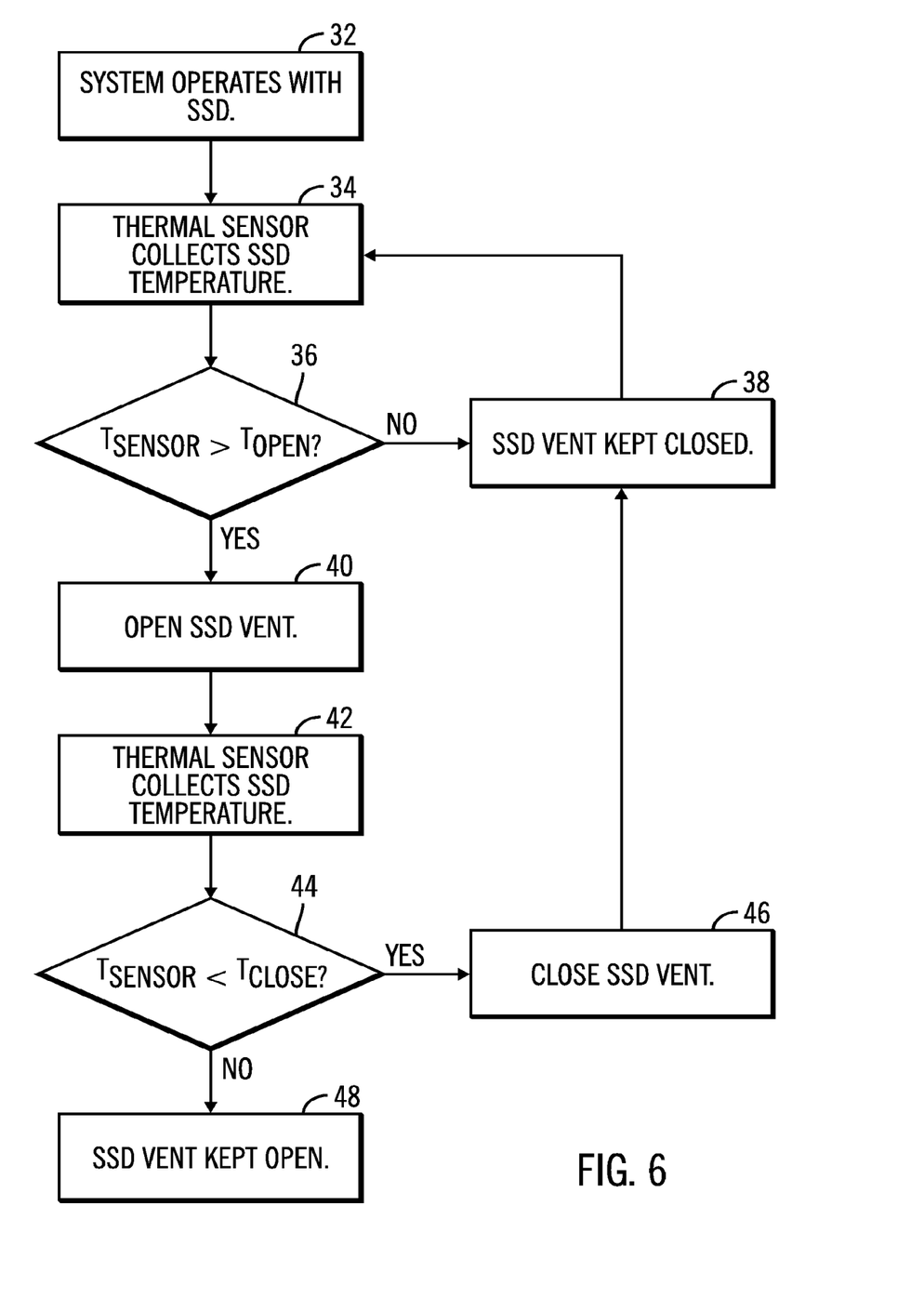
FIG. 6 illustrates a flow chart of operations, in accordance with certain embodiments.

FIG. 6 illustrates a flowchart of system operation for opening and closing one or more vents in a SSD enclosure, in accordance with certain embodiments. Block 32 includes system operation of a SSD. In certain embodiments the vent may begin in a closed position. Temperatures for opening the vent ($T_{OPEN}$) and closing the vent ($T_{CLOSE}$) are set to control the vent open/close status. Block 34 includes one or more thermal sensors in the system collecting SSD temperature data ($T_{SENSOR}$). Block 36 is determining whether the $T_{SENSOR}$ is greater than the predetermined $T_{OPEN}$. If the $T_{SENSOR}$ is not greater than the $T_{OPEN}$, then Block 38 includes keeping the vent closed and then returning to Block 36 for collecting the temperature data at another time if desired. The $T_{SENSOR}$ may be collected at any desired interval such as, for example, every 5 seconds. If the $T_{SENSOR}$ is greater than the $T_{OPEN}$, then Block 40 includes opening the vent. Block 42 is then collecting data from the sensor(s) in the system while the vent is open. Block 44 is determining whether the $T_{SENSOR}$ is less than the predetermined $T_{CLOSE}$. If the $T_{SENSOR}$ is less than the $T_{CLOSE}$, then Block 46 includes closing the vent and then returning to Block 38. If the $T_{SENSOR}$ is not less than the $T_{CLOSE}$, then Block 48 includes keeping the vent open and then returning to Block 42. Various time periods between temperature measurement data acquisition may be used. For example, as noted above, certain embodiments may utilize a 5 second interval between temperature measurements. Embodiments may also include, but are not limited to, intervals including at least a 5 second interval, a 1-10 second interval, and a 3-7 second interval. Depending on the expected drive use and other conditions, other time intervals may also be used.

Figure 7:
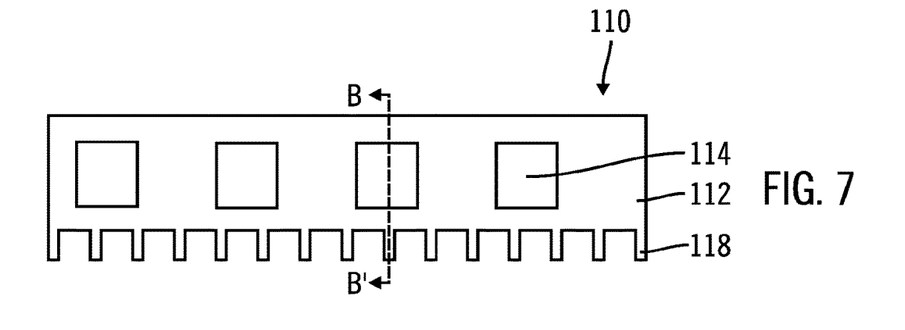
FIG. 7 illustrates a side view of a SSD, in accordance with certain embodiments.

As illustrated in FIGS. 2-4, certain embodiments may utilize a vent including a door that is closed and opened in a generally upwards and downwards motion. While FIGS. 3-4 show the doors 16 opening in a downward motion, embodiments may also include the use of a door that opens in an upward motion. Embodiments may also utilize a vent that opens in a different way, including, but not limited to, a door that moves in a horizontal or side-to-side motion. FIG. 7 illustrates a SSD 110 including a housing 112 and a plurality of vents 114 through which heat from an interior of the SSD 110 can be vented out. In the illustrated embodiment, a vent 114 may comprise an opening defined in the housing 112, and a structure including, but not limited to, a door (or window) 116 that can be opened and closed as desired. The housing 112 may also include a plurality of fins 1118 on one or more surfaces for transmitting heat away from the SSD 10 during operation.

Figure 8:
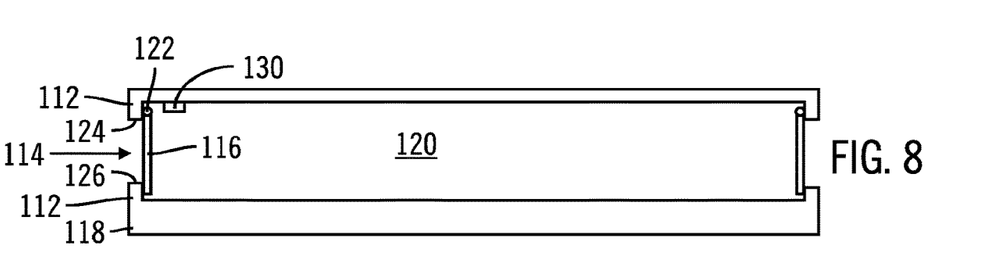
FIG. 8 illustrates a cross-sectional view of the SSD of FIG. 7, along line B-B', showing certain features in accordance with certain embodiments.

FIG. 8 illustrates a side cross-sectional view of the SSD 110 of FIG. 7 along the dashed line B-B'. As shown in the illustrated embodiment, the vent 114 includes the door 116 positioned to block the flow of air (or other substance) through the opening between the surfaces 124, 126 of the housing 12 and into (and out of) the interior region 120 in the SSD 110. Any suitable actuation mechanism 122 may be positioned in the interior region 120 and act to open and close the vents 114 by opening and closing the doors 116. As illustrated in FIG. 8, the door actuation mechanism may in certain embodiments be positioned to be coupled to an upper portion of the doors 116. Any suitable location may be used for the actuation mechanism and any switches used to control the actuation mechanism.

As illustrated in FIG. 8, the opening between the surface 124 and the surface 126 is blocked by the door 116 positioned in an interior region 120. Any suitable actuation mechanism 122 such as, for example, a roller mechanism, may be used to open and close the door 116. In the embodiment illustrated in FIG. 8, the actuation mechanism 122 is positioned above the door 116. The door actuation mechanism may in certain embodiments be a slider mechanism that moves one or more of the doors in a horizontal or side-to-side motion. A suitable switch 124, including, but not limited to, an electromagnetic switch, may be used to control the actuation mechanism 122.

Figure 9:
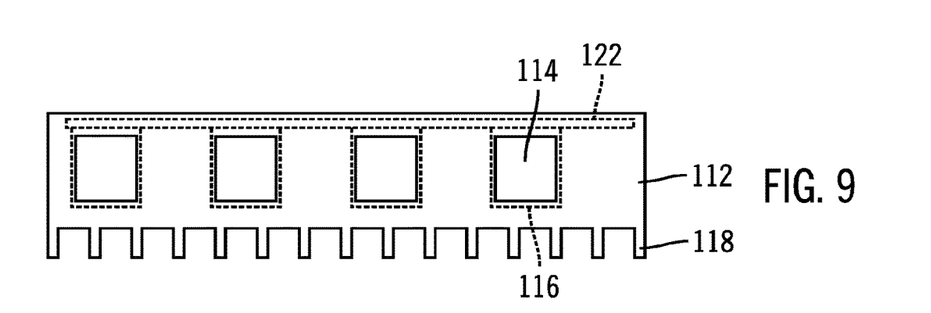
FIG. 9 illustrates a side view of the SSD of FIG. 7, showing certain features when the vents are in a closed position, in accordance with certain embodiments.
Figure 10:
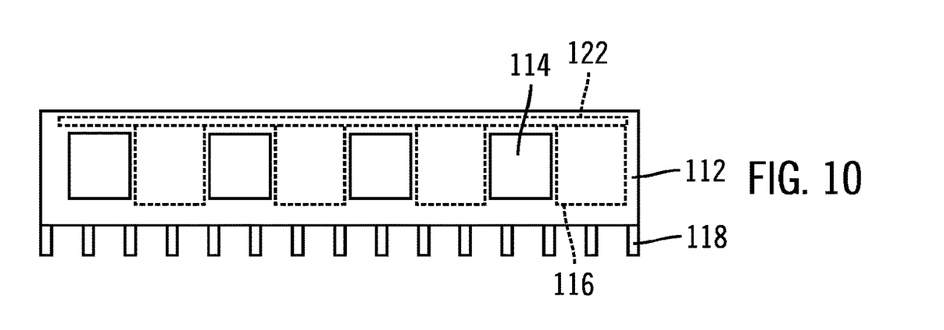
FIG. 10 illustrates a side view of the SSD of FIG. 7, showing certain features when the vents are in an open position, in accordance with certain embodiments.

FIG. 9 illustrates a view similar to that in FIG. 7 of an SSD 110 embodiment, further including dotted lines outlining the position of the doors 116 and the actuation mechanism 122, which may be positioned in the interior region 120 of the SSD 10, as seen in FIG. 8. In FIG. 9, the vents 114 are closed, with the doors 116 positioned to block the openings defined by the housing 112. FIG. 10 illustrates the SSD 110 including open vents 114, with the dotted lines showing the position of the doors 116 after they have been slid to a side (behind the housing 112) so that the openings defined by the housing are open to the interior region of the SSD 110. By moving the doors 116 of the vents 114 in a side-to-side motion, they can be opened and closed while extending into the interior region 120 a smaller distance than if the doors were to open inward as illustrated in the embodiment shown in FIG. 4, for example.

Figure 11:
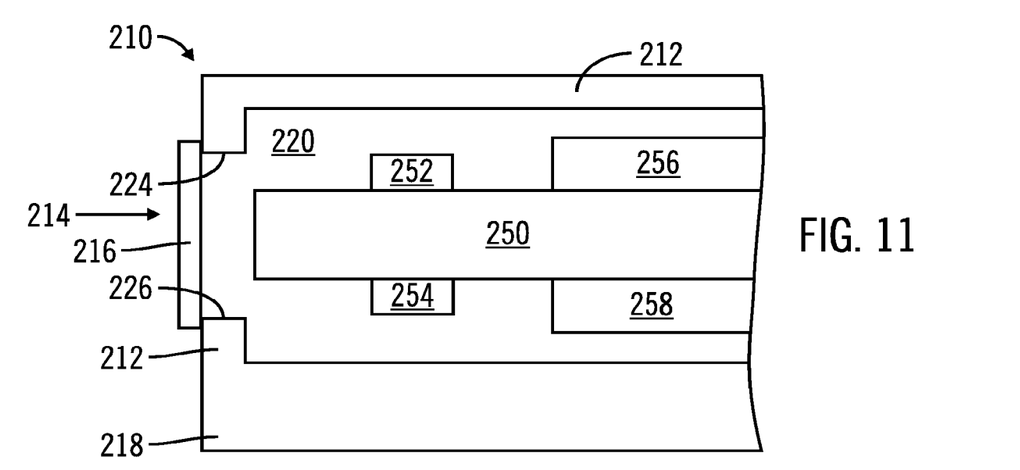
FIG. 11 illustrates a cross-sectional view of a portion of a SSD, in accordance with certain embodiments.

While certain embodiments include positioning the doors of the vents in an interior portion of the SSD enclosure, embodiments may also position the doors of the vents at other locations. For example, FIG. 11 illustrates a cross-sectional view of a portion of a SSD 210 in accordance with certain embodiments, including a housing 212 including fin 218. The SSD 210 includes door 216 that is positioned on an outer surface of the housing 212 to close the vent 214 between the surfaces 224 and 226. FIG. 11 also illustrates the presence of a printed circuit board (PCB) 250 including a plurality of components 252, 254, 256, 258 thereon. A PCB with components such as illustrated in FIG. 11 may be present in various SSD embodiments described herein. The components 252, 254, 256, 258 may include a variety of suitable components including, but not limited to, one or more controller chips, temperature sensors, and memory chips. Any suitable mechanism may be utilized for opening and closing the vents by actuating the doors 216, including actuation and switch mechanisms as described above. One of the components 252, 254, 256, 258 on the PCB may be a controller that is integrated into the SSD 210 and programmed to send signals based on the sensed temperature to such switch and actuation mechanism for opening and closing the vents.

Figure 12:
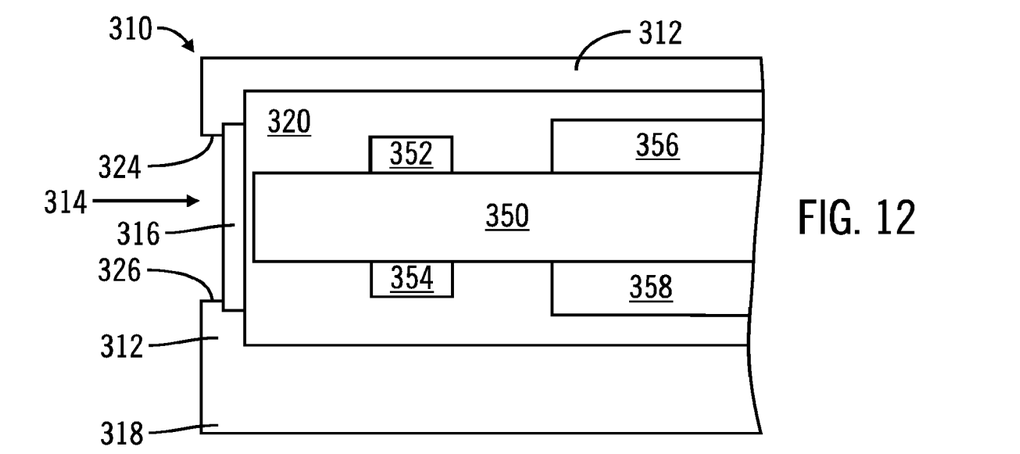
FIG. 12 illustrates a cross-sectional view of a portion of a SSD, in accordance with certain embodiments.

FIG. 12 illustrates a cross-sectional view of a portion of a SSD 310 in accordance with certain embodiments, including housing 312 including fin 318. The SSD 310 includes a door 316 for closing the vent 314 that is positioned in a stepped portion of the housing 312 adjacent to surfaces 324, 326. FIG. 12 also illustrates the presence of a printed circuit board (PCB) 350 including a plurality of suitable SSD components 352, 354, 356, 358 thereon.

Figure 13:
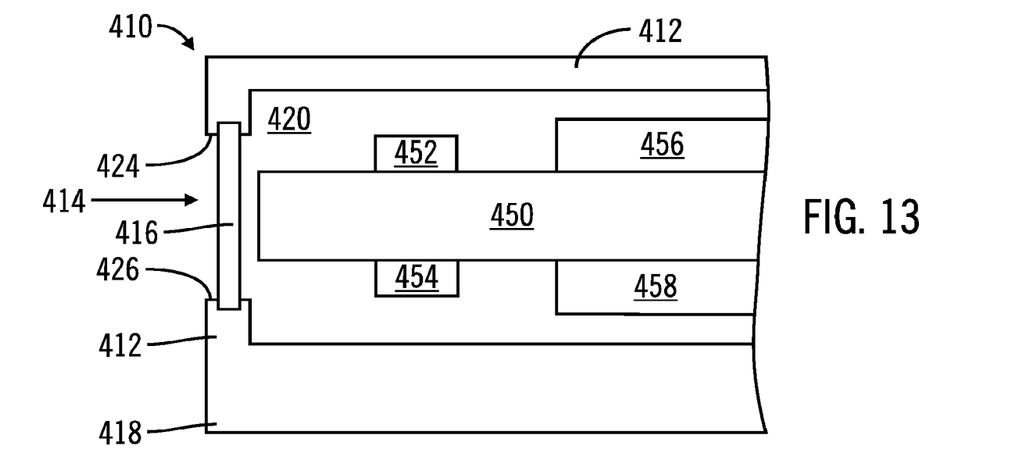
FIG. 13 illustrates a cross-sectional view of a portion of a SSD, in accordance with certain embodiments.

FIG. 13 illustrates a cross-sectional view of a portion of a SSD 410 in accordance with certain embodiments, including housing 412 including fin 418. The SSD 410 includes a door 416 that is positioned in grooved regions along surfaces 424, 426 of the housing 412. FIG. 13 also illustrates the presence of a printed circuit board (PCB) 450 including a plurality of suitable SSD components 452, 454, 456, 458 thereon.

Embodiments may utilize any suitable controlling, actuation, and/or switching mechanism for opening and closing the vents. As noted above in connection with FIG. 11, components on a PCB in the interior region of the SSD may include a controller that sends the appropriate signal to the switch and/or actuation mechanism for controlling the vents.

The position of the doors and the type of actuation utilized may influence the positioning of a PCB within the enclosure, or, alternatively, the position of the door or other vent structure used to open and close the venting pathway. For example, as illustrated in FIG. 11, by positioning the door 216 for the vent on an outer portion of the housing 212, the door may be actuated in a manner so that it does not open into the interior region 220 of the SSD enclosure. This enables the PCB 250 and the housing 212 to be relatively close together. If the door for the vent is positioned to open and close in a manner that extends into the interior region, then a larger distance may be needed between the PCB and the SSD housing.

Embodiments may include more than one row of vents. For example, FIG. 14 illustrates a portion of a SSD 510 in accordance with certain embodiments, including a housing 512 having a plurality of fins 518, and further including two rows of closed vents 514A, 514B, with the vents 514A, 514B each including a door 516A, 516B positioned in an interior region and having its edges indicated by dotted lines.

Figure 14:
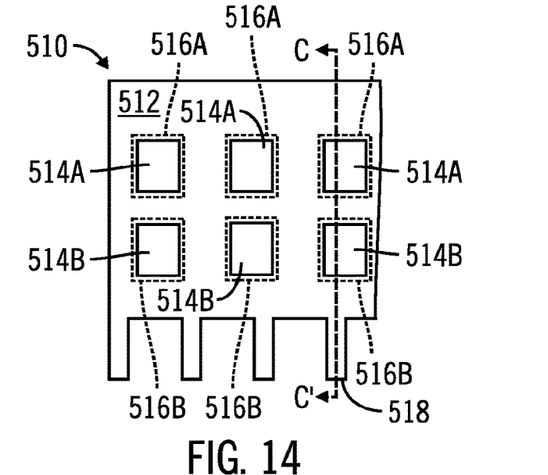
FIG. 14 illustrates a side view of a portion of a SSD, including two rows of vents, in accordance with certain embodiments.
Figure 15:
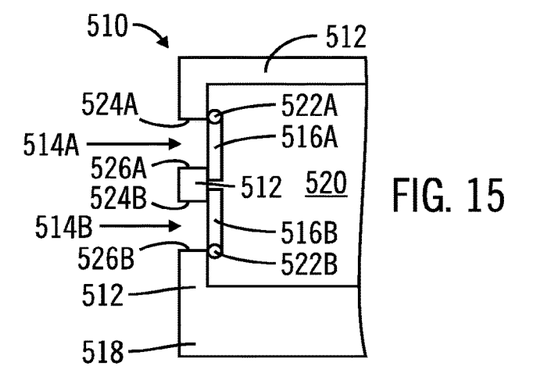
FIG. 15 illustrates a cross-sectional view of the SSD of FIG. 14, in accordance with certain embodiments.

FIG. 15 illustrates a cross-sectional view along the dashed line C-C' of FIG. 14, showing the position of the doors 516A, 516B of the vent 514. Actuation mechanism 522A is positioned at the upper end of the door 516A and actuation mechanism 522B is positioned at the lower end of door 516B.

Figure 16:
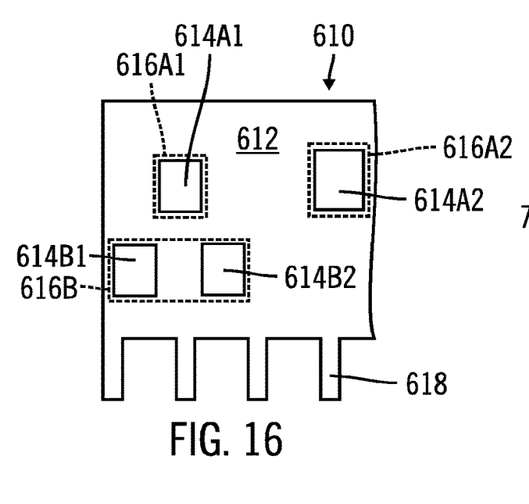
FIG. 16 illustrates a side view of a portion of a SSD, including two rows of vents, in accordance with certain embodiments.

Embodiments may include vents of varying size and position. For example, if certain areas get hotter than other areas, then the opening and the door size adjacent to the hotter area may be larger than at other locations. FIG. 16 illustrates a portion of an SSD 610 in accordance with certain embodiments, including a housing 612 having a plurality of fins 618, and further including first row of vents 614A1, 614A2, and a second row of vents 614B1, 614B2. The position of doors for closing the vents is indicated by dotted line, including doors 616A1 and 616A2 in the first row, and door 616B in the second row. As illustrated in FIG. 16, in the first row, vent 614A2 has a larger size than vent 614A1. In the second row, vent 614B1 and vent 614B2 are the same size. In addition, the spacing between vent 614A1 and vent 614A2 is larger than the spacing between vent 614B1 and vent 614B2. Furthermore, as illustrated in FIG. 16, the vents in the first rows are not be aligned with the vents in the second row, with vent 614A1 being offset from vent 614B1, and vent 614A2 being offset from vent 614B2.

Figure 17:
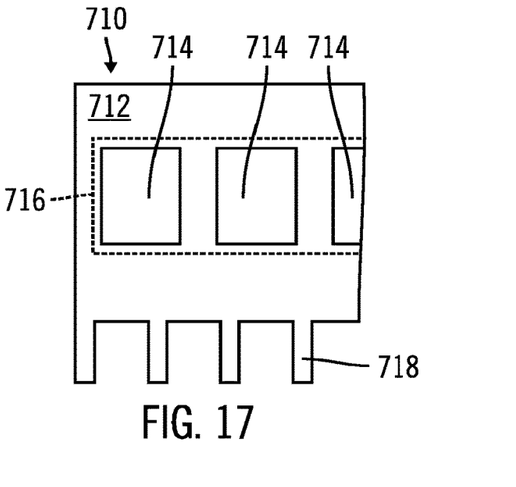
FIG. 17 illustrates a side view of a portion of a SSD, in accordance with certain embodiments.

In addition, embodiments may include vents configured so that multiple openings in an SSD enclosure can be closed using a single door. For example, in FIG. 16, vent 614B1 and 614B2 are closed using the same door 616B. FIG. 17 illustrates an embodiment of a SSD 710 in accordance with certain embodiments, including a housing 712 having a plurality of fins 718, and further including a single door 716 configured to close all of the vents 714.

Figure 18:
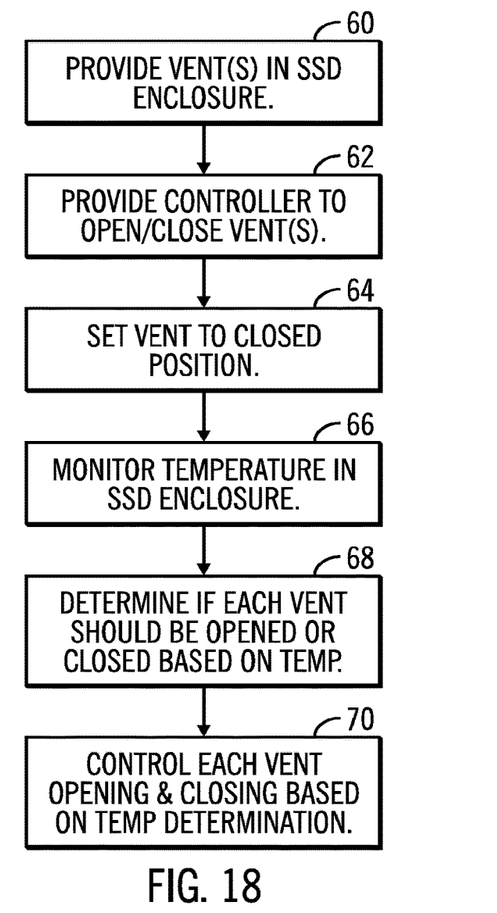
FIG. 18 illustrates a flow chart of operations, in accordance with certain embodiments.

FIG. 18 illustrates a flowchart of operations that may be carried out in accordance with certain embodiments. Block 60 is providing one or more vents in a SSD enclosure. Block 62 is providing one or more moveable structures (for example, doors) that can be opened and closed. Block 64 is opening and closing one or more of the vents using, for example, a controller to send a signal to an actuation mechanism. Where multiple vents are used, they may be selectively operated to open and closed individually (independent of one another), open and close together, or open and close in any desired grouping. Block 66 is monitoring the temperature inside of the SSD enclosure using one or more sensors. Block 68 is determining if each vent should be opened or closed based on the temperature. Block 70 is controlling the opening and closing of each vent based on the temperature determination. Such control may be carried out over any time period and repeated as desired.

Various features of embodiments described above may be implemented with respect to other embodiments, including apparatus and method embodiments. Embodiments may be used in a variety of computing systems, including, but not limited to, drives used in server, storage, and PC (personal computer) systems. The order of certain operations as set forth in embodiments may also be modified. Specifics in various embodiments and examples may be used in other embodiments.

In the foregoing description above, various features are grouped together for the purpose of streamlining the disclosure. This method of disclosure is not to be interpreted as reflecting an intention that the claimed embodiments of the invention require more features than are expressly recited in each claim. Rather, as the claims reflect, inventive subject matter may lie in less than all features of a single disclosed embodiment. Thus the claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art. For example, while the various openings and doors in certain figures are illustrated as rectangular in shape, other shapes are also possible. The terms "a" and "an" mean "one or more", unless expressly specified otherwise. In addition, terms such as "first", "second", "third", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting. Embodiments may be manufactured, used, and contained in a variety of positions and orientations.

EXAMPLES

The following examples relate to various embodiments. Specifics in the Examples may be used anywhere in one or more embodiments.

Example 1 is a solid state drive (SSD) comprising a housing including a plurality of sides surrounding an interior region; a temperature sensor; and at least one vent in the housing, the at least one vent configured to be opened and closed based on temperature data sensed by the temperature sensor.

In Example 2, the subject matter of Examples 1 and 3-14 can optionally include the housing including a first side opposite a second side, the at least one vent comprising a plurality of vents on the first side and a plurality of vents on the second side.

In Example 3, the subject matter of Examples 1-2 and 4-14 can optionally include the at least one vent comprising a plurality of vents configured in two rows on at least one side of the housing.

In Example 4, the subject matter of Examples 1-3 and 5-14 can optionally include a controller that is programmed to open the at least one vent when a first temperature is reached in the housing, and programmed to close the at least one vent when a second temperature is reached in the housing, the first temperature being greater than the second temperature.

In Example 5, the subject matter of Examples 1-4 and 6-14 can optionally include wherein the at least one vent comprises an opening in the housing and a structure configured to impede a flow of gas into the interior region when in a closed position and to permit the flow of gas into the interior region when in an open position.

In Example 6, the subject matter of Examples 1-5 and 7-14 can optionally include wherein the structure is positioned in the interior region.

In Example 7, the subject matter of Examples 1-6 and 8-14 can optionally include wherein the structure comprises a door, and further comprising a door actuation mechanism selected from the group consisting of a roller mechanism and a slider mechanism.

In Example 8, the subject matter of Examples 1-7 and 9-14 can optionally include wherein the at least one vent comprises a plurality of vents, and wherein the controller is configured to independently control each vent.

In Example 9, the subject matter of Examples 1-8 and 10-14 can optionally include a printed circuit board (PCB) in the interior region, the PCB including a plurality of memory chips positioned thereon.

In Example 10, the subject matter of any one of claims 1-9 and 11-14 can optionally include wherein the SSD comprises a drive having a form factor selected from the group consisting of 2.5 inch and 3.5 inch drive form factors.

Example 11 is a solid state drive (SSD) comprising: a housing including a plurality of sides surrounding an interior region; at least one vent on the housing, the at least one vent configured to be opened and closed in response to a signal; a temperature sensor; a controller configured to send a signal to: open the at least one vent when a temperature sensed inside the interior region reaches a first temperature; and close the at least one vent when a temperature sensed inside the interior region reaches a second temperature, wherein the first temperature is greater than the second temperature.

In Example 12, the subject matter of Examples 1-11 and 13-14 can optionally include wherein the at least one vent comprises a plurality of vents, and wherein the controller is configured to independently control each vent.

In Example 13, the subject matter of Examples 1-12 and 14 can optionally include wherein the second temperature is 2° C. to 4° C. less than the first temperature.

In Example 14, the subject matter of Examples 1-13 can optionally include wherein the at least one vent comprises an opening in the housing and a structure configured to impede a flow of gas into the interior region when in a closed position and to permit the flow of gas into the interior region when in an open position, and wherein the structure is positioned in the interior region.

Example 15 is a method for controlling the temperature of a solid state drive (SSD), comprising selectively opening and closing at least one vent in the solid state drive in response to measured temperature data.

In Example 16, the subject matter of Examples 15 and 17-23 can optionally include wherein the selectively opening and closing the at least one vent comprises: positioning the vent in a closed configuration; after the positioning the vent in the closed configuration, sensing a first SSD temperature; opening the vent in response to a determination that the first SSD temperature is greater than a first predetermined temperature; and after the opening the vent in response to the determination, sensing a second SSD temperature and closing the vent in response to a determination that the second SSD temperature is less than a second predetermined temperature, wherein the second predetermined temperature is less than the first predetermined temperature.

In Example 17, the subject matter of Examples 15-16 and 18-23 can optionally include, after the closing the vent in response to the determination that the second SSD temperature is less than the second predetermined temperature, sensing a third SSD temperature and opening the vent in response to a determination that the third SSD temperature is greater than the first predetermined temperature.

In Example 18, the subject matter of Examples 15-17 and 19-23 can optionally include, after the closing the vent in response to the determination that the second SSD temperature is less than the second predetermined temperature, sensing a third SSD temperature and keeping the vent closed in response to a determination that the third SSD temperature is not greater than the first predetermined temperature.

In Example 19, the subject matter of Examples 15-18 and 20-23 can optionally include wherein the selectively opening and closing the vent comprises: positioning the vent in a closed configuration; after the positioning the vent in the closed configuration, sensing a first SSD temperature; determining whether the first SSD temperature is greater than a first predetermined temperature; opening the vent in response to a determination that the first SSD temperature is greater than the first predetermined temperature; and after the opening the vent in response to the determination, sensing a second SSD temperature and keeping the vent open in response to a determination that the second SSD temperature is not less than a second predetermined temperature, wherein the second predetermined temperature is less than the first predetermined temperature.

In Example 20, the subject matter of Examples 15-19 and 21-23 can optionally include, after the keeping the vent open in response to the determination that the second SSD temperature is not less than the second predetermined temperature, sensing a third SSD temperature and keeping the vent open in response to a determination that the third SSD temperature is not less than the second predetermined temperature.

In Example 21, the subject matter of Examples 15-20 and 22-23 can optionally include, after the keeping the vent open in response to the determination that the second SSD temperature is not less than the second predetermined temperature, sensing a third SSD temperature and closing the vent in response to a determination that the third SSD temperature is less than the second predetermined temperature.

In Example 22, the subject matter of Examples 15-21 and 23 can optionally include wherein the sensing the second SSD temperature is carried out at least 5 seconds after the sensing the first SSD temperature.

In Example 23, the subject matter of Examples 15-22 can optionally include wherein the second predetermined temperature is less than the first predetermined temperature by an amount in the range of 2° C. to 4° C.

Example 24 is a solid state drive (SSD) comprising: means for housing a plurality of SSD components; and means for opening and closing a vent in the SSD in response to measured temperature data sensed in the SSD.

Example 25 is a solid state drive (SSD) enclosure comprising: a housing including a plurality of sides surrounding an interior region; and at least one vent in the housing, the at least one vent configured to be opened and closed based on temperature data sensed by a temperature sensor.

In Example 26, the subject matter of Examples 25 and 27-37 can optionally include the housing including a first side opposite a second side, the at least one vent comprising a plurality of vents on the first side and a plurality of vents on the second side.

In Example 27, the subject matter of Examples 25-26 and 28-37 can optionally include the at least one vent comprising a plurality of vents configured in two rows on at least one side of the housing.

In Example 28, the subject matter of Examples 25-27 and 29-37 can optionally include a controller that is programmed to open the at least one vent when a first temperature is reached in the housing, and programmed to close the at least one vent when a second temperature is reached in the housing, the first temperature being greater than the second temperature.

In Example 29, the subject matter of Examples 25-28 and 30-37 can optionally include wherein the at least one vent comprises an opening in the housing and a structure configured to impede a flow of gas into the interior region when in a closed position and to permit the flow of gas into the interior region when in an open position.

In Example 30, the subject matter of Examples 25-29 and 31-37 can optionally include wherein the structure is positioned in the interior region.

In Example 31, the subject matter of Examples 25-30 and 32-37 can optionally include wherein the structure comprises a door, and further comprising a door actuation mechanism selected from the group consisting of a roller mechanism and a slider mechanism.

In Example 32, the subject matter of Examples 25-31 and 33-37 can optionally include wherein the at least one vent comprises a plurality of vents, and wherein the controller is configured to independently control each vent.

In Example 33, the subject matter of Examples 25-32 and 34-37 can optionally include wherein the SSD enclosure has a form factor selected from the group consisting of 2.5 inch and 3.5 inch drives.

Example 34 is a solid state drive (SSD) enclosure comprising: a housing including a plurality of sides surrounding an interior region; at least one vent on the housing, the at least one vent configured to be opened and closed in response to a signal; a temperature sensor; a controller configured to send a signal to: open the at least one vent when a temperature sensed inside the interior region reaches a first temperature; and close the at least one vent when a temperature sensed inside the interior region reaches a second temperature, wherein the first temperature is greater than the second temperature.

In Example 35, the subject matter of Examples 25-34 and 36-37 can optionally include wherein the at least one vent comprises a plurality of vents, and wherein the controller is configured to independently control each vent.

In Example 36, the subject matter of Examples 25-35 and 37 can optionally include wherein the second temperature is 2° C. to 4° C. less than the first temperature.

In Example 37, the subject matter of Examples 25-36 can optionally include wherein the at least one vent comprises an opening in the housing and a structure configured to impede a flow of gas into the interior region when in a closed position and to permit the flow of gas into the interior region when in an open position, and wherein the structure is positioned in the interior region.

Example 38 is a solid state drive (SSD) enclosure comprising: means for housing a plurality of SSD components in an interior region thereof; and means for opening and closing a vent in the SSD enclosure in response to measured temperature data sensed in the interior region.

Example 39 is an apparatus comprising means to perform a method as claimed in any preceding claim.

Example 40 is machine-readable storage including machine-readable instructions, when executed, to implement a method or realize an apparatus as claimed in any preceding claim.

What is claimed:

1. A solid state drive (SSD) comprising:
a housing including a plurality of sides surrounding an interior region;
a temperature sensor; and
at least one vent in the housing, the at least one vent comprising:
an opening in the housing;
a structure configured to impede a flow of gas into the interior region when in a closed position and to permit the flow of gas into the interior region when in an open position, wherein the structure comprises:
a door, and
a door actuation mechanism selected from the group consisting of a roller mechanism and a slider mechanism; and
a first plurality of vents on a first side of the housing and a second plurality of vents on a second side of the housing, wherein the first side is different than the second side, wherein the first and second plurality of vents are each individually configured to be opened and closed based on temperature data sensed by the temperature sensor.

2. The solid state drive of claim 1, the at least one vent comprising a plurality of vents configured in two rows on at least one side of the housing.

3. The solid state drive of claim 1, further comprising a controller that is programmed to open the at least one vent when a first temperature is reached in the housing, and programmed to close the at least one vent when a second temperature is reached in the housing, the first temperature being greater than the second temperature.

4. The solid state drive of claim 1, wherein the structure is positioned in the interior region.

5. The solid state drive of claim 1, further comprising a printed circuit board (PCB) in the interior region, the PCB including a plurality of memory chips positioned thereon.

6. The solid state drive of claim 1, wherein the SSD comprises a drive having a form factor selected from the group consisting of 2.5 inch and 3.5 inch drive form factors.

7. A solid state drive (SSD) comprising:
a housing including a plurality of sides surrounding an interior region;
at least one vent on the housing, the at least one vent comprising:
an opening in the housing;
a structure configured to impede a flow of gas into the interior region when in a closed position and to permit the flow of gas into the interior region when in an open position, wherein the structure comprises:
a door, and
a door actuation mechanism selected from the group consisting of a roller mechanism and a slider mechanism; and
a first plurality of vents on a first side of the housing; and
a second plurality of vents on a second side of the housing, wherein the first side is different than the second side, wherein the first and second plurality of vents are each individually configured to be opened and closed in response to a signal;
a temperature sensor;
a controller configured to send a signal to:
open the at least one vent when a temperature sensed inside the interior region reaches a first temperature;
and close the at least one vent when a temperature sensed inside the interior region reaches a second temperature, wherein the first temperature is greater than the second temperature, and wherein the controller is configured to independently control each vent.

8. The solid state drive of claim 7, wherein the second temperature is 2° C. to 4° C. less than the first temperature.

9. The solid state drive of claim 7, wherein the structure is positioned in the interior region.

10. A method for controlling the temperature of a solid state drive (SSD), comprising selectively opening and closing at least one vent in the solid state drive in response to measured temperature data, the at least one vent comprising:
an opening in the housing;
a structure configured to impede a flow of gas into the interior region when in a closed position and to permit the flow of gas into the interior region when in an open position, wherein the structure comprises:
a door, and
a door actuation mechanism selected from the group consisting of a roller mechanism and a slider mechanism; and
a first plurality of vents on a first side of a housing; and
a second plurality of vents on a second side of the housing, wherein the first side is different than the second side, wherein the first and second plurality of vents are each individually configured to be opened and closed based on the measured temperature data.

11. The method of claim 10, wherein the selectively opening and closing the at least one vent comprises:
positioning the vent in a closed configuration;
after the positioning the vent in the closed configuration, sensing a first SSD temperature;
opening the vent in response to a determination that the first SSD temperature is greater than a first predetermined temperature;
and after the opening the vent in response to the determination, sensing a second SSD temperature and closing the vent in response to a determination that the second SSD temperature is less than a second predetermined temperature, wherein the second predetermined temperature is less than the first predetermined temperature.

12. The method of claim 11, further comprising, after the closing the vent in response to the determination that the second SSD temperature is less than the second predetermined temperature, sensing a third SSD temperature and opening the vent in response to a determination that the third SSD temperature is greater than the first predetermined temperature.

13. The method of claim 11, further comprising, after the closing the vent in response to the determination that the second SSD temperature is less than the second predetermined temperature, sensing a third SSD temperature and keeping the vent closed in response to a determination that the third SSD temperature is not greater than the first predetermined temperature.

14. The method of claim 10, wherein the selectively opening and closing the vent comprises:
positioning the vent in a closed configuration;
after the positioning the vent in the closed configuration, sensing a first SSD temperature;
determining whether the first SSD temperature is greater than a first predetermined temperature;
opening the vent in response to a determination that the first SSD temperature is greater than the first predetermined temperature;
and after the opening the vent in response to the determination, sensing a second SSD temperature and keeping the vent open in response to a determination that the second SSD temperature is not less than a second predetermined temperature, wherein the second predetermined temperature is less than the first predetermined temperature.

15. The method of claim 14, further comprising, after the keeping the vent open in response to the determination that the second SSD temperature is not less than the second predetermined temperature, sensing a third SSD temperature and keeping the vent open in response to a determination that the third SSD temperature is not less than the second predetermined temperature.

16. The method of claim 14, further comprising, after the keeping the vent open in response to the determination that the second SSD temperature is not less than the second predetermined temperature, sensing a third SSD temperature and closing the vent in response to a determination that the third SSD temperature is less than the second predetermined temperature.

17. The method of claim 11, wherein the sensing the second SSD temperature is carried out at least 5 seconds after the sensing the first SSD temperature.

18. The method of claim 11, wherein the second predetermined temperature is less than the first predetermined temperature by an amount in the range of 2° C. to 4° C.

* * * * *